United States Patent
Mashita et al.

(10) Patent No.: US 8,196,071 B2
(45) Date of Patent: Jun. 5, 2012

(54) CREATING MASK DATA OF INTEGRATED CIRCUIT PATTERNS USING CALCULATED ETCHING CONVERSION DIFFERENCE

(75) Inventors: Hiromitsu Mashita, Kanagawa (JP);
Katsumi Iyanagi, Kanagawa (JP);
Takafumi Taguchi, Kanagawa (JP);
Toshiya Kotani, Tokyo (JP); Hidefumi Mukai, Kanagawa (JP); Taiga Uno, Kanagawa (JP); Takashi Nakazawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 12/688,644

(22) Filed: Jan. 15, 2010

(65) Prior Publication Data
US 2010/0185313 A1 Jul. 22, 2010

(30) Foreign Application Priority Data
Jan. 16, 2009 (JP) .................................. 2009-008135

(51) Int. Cl.
*G06F 17/50* (2006.01)
(52) U.S. Cl. ................. 716/54; 716/51; 716/52; 716/53; 430/5
(58) Field of Classification Search .................... 716/51, 716/52, 53, 54; 430/5
See application file for complete search history.

(56) References Cited

U.S. PATENT DOCUMENTS

| | | | | |
|---|---|---|---|---|
| 5,863,682 A | * | 1/1999 | Abe et al. ......................... | 430/30 |
| 6,128,363 A | * | 10/2000 | Shoki et al. ...................... | 378/35 |
| 6,334,209 B1 | * | 12/2001 | Hashimoto et al. .............. | 716/52 |
| 7,266,801 B2 | * | 9/2007 | Kotani et al. .................... | 716/52 |
| 7,689,968 B2 | * | 3/2010 | Sato ................. | 716/53 |
| 7,700,997 B2 | * | 4/2010 | Futatsuyama et al. ......... | 257/326 |
| 7,716,617 B2 | * | 5/2010 | Mashita et al. ................ | 716/119 |
| 2007/0266360 A1 | * | 11/2007 | Cheng et al. ..................... | 716/11 |
| 2008/0178141 A1 | * | 7/2008 | Sato ................. | 716/19 |
| 2009/0087757 A1 | * | 4/2009 | Onoue .............................. | 430/5 |
| 2009/0089727 A1 | * | 4/2009 | Iyanagi ............................. | 716/5 |
| 2010/0003819 A1 | | 1/2010 | Taguchi et al. | |

FOREIGN PATENT DOCUMENTS

| | | |
|---|---|---|
| JP | 08-321450 | 12/1996 |
| JP | 2004-333529 | 11/2004 |
| JP | 2005-181524 | 7/2005 |
| JP | 2006-060051 | 3/2006 |
| JP | 2007-127839 | 5/2007 |
| JP | 4131880 | 6/2008 |

* cited by examiner

*Primary Examiner* — Naum Levin
(74) *Attorney, Agent, or Firm* — Finnegan, Henderson, Farabow, Garrett & Dunner, L.L.P.

(57) ABSTRACT

A pattern data creating method comprising: referring to a first correspondence relation between an amount of dimension variation between a first pattern formed on a substrate and a second pattern formed by processing the substrate using the first pattern and either one of a pattern total surface area and a pattern boundary length of the first pattern; and creating pattern data for forming the first pattern.

20 Claims, 6 Drawing Sheets

CREATING MASK DATA OF INTEGRATED
CIRCUIT PATTERNS USING CALCULATED
ETCHING CONVERSION DIFFERENCE

CROSS-REFERENCE TO RELATED
APPLICATIONS

This application is based upon and claims the benefit of priority from the prior Japanese Patent Application No. 2009-8135, filed on Jan. 16, 2009; the entire contents of which are incorporated herein by reference.

BACKGROUND OF THE INVENTION

1. Field of the Invention

The present invention relates to a pattern data creating method, a computer program product, and a semiconductor device manufacturing method.

2. Description of the Related Art

In recent years, there has been a striking progress in the semiconductor manufacturing technology and semiconductor device of the 50 nm half-pitch generation are being mass-produced. The miniaturization of semiconductor device symbolized by the 50 nm half-pitch generation is achieved by significant advance in the micropattern forming technology such as the mask processing technology, the lithography processing technology, and the etching processing technology. In the times when pattern sizes formed on a wafer were sufficiently large, patterns having the same shape as the patterns drawn by the designer were formed as mask patterns on a mask. Then, the mask patterns were transferred over a resist applied on the wafer using an exposure apparatus. That enabled formation of patterns as designed on the wafer. However, with the miniaturization of the pattern sizes in recent years, the effect that the diffraction of the exposure light has on the dimensions on the wafer has been growing. Moreover, it is becoming difficult to perform mask manufacturing or wafer processing in order to form micropatterns with precision. For that reason, even if mask patterns having the same shape as the designed patterns are used, it is becoming increasingly difficult to form the pattern shapes as per the design on a wafer.

As a method of faithful formation of patterns having the same shape as the designed patterns on a wafer, the designed patterns on mask patterns are subjected to optical proximity correction (OPC) or process proximity correction (PPC).

As one of the PPC techniques, a method has been proposed in which variability in the processing conversion difference (between post-development resist shapes and post-etching pattern shapes) for each product can be reduced by arranging on the design layout dummy patterns that are irrelative to the circuit behavior. The dummy patterns are arranged on the design layout with a predetermined density so that a pattern coverage ratio (pattern forming ratio) inside the wafer plane is within a predetermined range.

Japanese Patent Application Laid-open No. 2006-60051 discloses a pattern designing method in which a dummy pattern forming region is split in a plurality of dummy pattern forming unit regions and a plurality of test ranges having a larger area than the dummy pattern forming unit regions are set in such a way that a part of each test range is overlapping. Then, tentative pattern coverage ratios are calculated for dummy patterns formed inside the dummy pattern forming unit regions within the test ranges and an averaging procedure is performed on the tentative pattern coverage ratios to calculate a final pattern coverage ratio. Subsequently, dummy patterns having the area equivalent to the final pattern coverage ratio are generated as patterns inside the dummy pattern forming unit regions.

However, by only adjusting the pattern coverage ratio as described in the abovementioned conventional technology, it was not possible to form patterns of accurate shapes on a wafer. This problem is attributed to the fact that, due to the difference in the occupancy of cells formed on a wafer, the attached amount of a side wall protective film or the etching time differs thereby resulting in variability in the processing conversion difference. To curb such variability in the processing conversion difference, it is necessary to newly obtain the PPC data for each product and then create a mask. That causes an increase in the development turnaround time (TAT).

BRIEF SUMMARY OF THE INVENTION

A pattern data creating method according to an embodiment of the present invention comprises: referring to a first correspondence relation between an amount of dimension variation between a first pattern formed on a substrate and a second pattern formed by processing the substrate using the first pattern and either one of a pattern total surface area and a pattern boundary length of the first pattern; and creating pattern data for forming the first pattern.

A computer program product having a computer-readable recording medium including a plurality of commands for creating pattern data executable in a computer according to an embodiment of the present invention, the commands causes the computer to execute referring to a first correspondence relation between an amount of dimension variation between a first pattern formed on a substrate and a second pattern formed by processing the substrate using the first pattern and either one of a pattern total surface area and a pattern boundary length of the first pattern; and creating pattern data for forming the first pattern.

A semiconductor device manufacturing method according to an embodiment of the present invention comprises: referring to a first correspondence relation between an amount of dimension variation between a first pattern formed on a substrate and a second pattern formed by processing the substrate using the first pattern and either one of a pattern total surface area and a pattern boundary length of the first pattern; creating pattern data for forming the first pattern; and manufacturing a semiconductor device using the pattern data.

DETAILED DESCRIPTION OF THE INVENTION

Exemplary embodiments of a pattern data creating method, a computer program product, and a semiconductor device manufacturing method according to the present invention will be explained below in detail with reference to the accompanying drawings. The present invention is not limited to the following embodiments.

Figure 1:
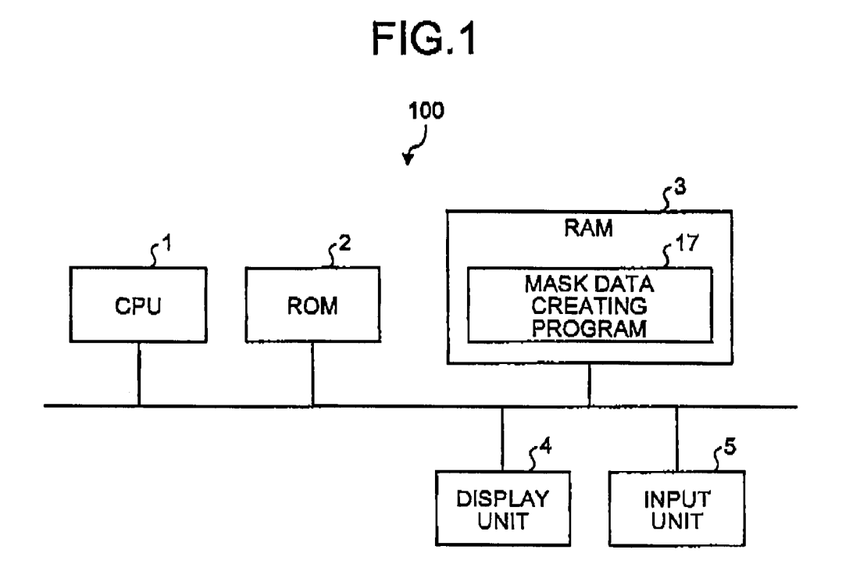
FIG. 1 is a schematic diagram of a configuration of a pattern data creating apparatus according to the present embodiment.

FIG. 1 is a schematic diagram of a configuration of a pattern data creating apparatus according to the present embodiment. A pattern data creating apparatus 100 is an apparatus such as a computer that creates mask pattern data of a photo mask used in photolithography as a semiconductor device manufacturing process or that creates pattern data of a template used in imprint lithography. In the present embodiment, the description is given about an apparatus for creating mask pattern data of a photo mask used in photolithography and about a method using that apparatus. The pattern data creating apparatus 100 according to the present embodiment calculates an etching conversion difference (pattern dimension variation amount), which is the processing conversion difference between a post-lithography (post-development) resist pattern (post-lithography pattern 44 described later) and a post-etching pattern (post-etching pattern 45 described later), and creates pattern data (mask data 43) of integrated circuit patterns using the calculated etching conversion difference. The pattern data creating apparatus 100 creates the mask data 43 by correcting a lithography target 42 described later.

The pattern data creating apparatus 100 includes a central processing unit (CPU) 1, a read only memory (ROM) 2, a random access memory (RAM) 3, a display unit 4, and an input unit 5. In the pattern data creating apparatus 100, the CPU 1, the ROM 2, the RAM 3, the display unit 4, and the input unit 5 are interconnected via a bus line.

The CPU 1 creates the mask data by executing a mask data creating program 17 that is a computer program for mask data creation. The mask data creating program 17 is configured to include a dimension variation amount calculating program for calculating the processing conversion difference (etching conversion difference) between the post-lithography pattern 44 and the post-etching pattern 45. The mask data creating program 17 creates the mask data of integrated circuit patterns using the calculated etching conversion difference. The etching conversion difference (dimension variation in integrated circuit) that occurs when etching is performed can be estimated using processing simulation or estimated based on pattern widths or distance relationships up to adjacent patterns. In addition, the mask data creating program 17 creates a mask creation model such as a model for correcting existing mask data using the calculated etching conversion difference and then uses that mask correction model to create the mask data of integrated circuit patterns.

The display unit 4 is a display device such as a liquid crystal display (LCD) monitor that is used to display information such as design layout data, design drawings, the lithography target 42, and the mask data 43 according to instructions from the CPU 1. The input unit 5 includes a mouse or a keyboard and is used by the user to externally input instruction information (information necessary for mask data creation). The instruction information input to the input unit 5 is sent to the CPU 1.

The mask data creating program 17 is stored in the ROM 2 and loaded in the RAM 3 via the bus line. The CPU 1 then executes the mask data creating program 17 loaded in the RAM 3. More particularly, in the pattern data creating apparatus 100; according to an instruction input by the user from the input unit 5, the CPU 1 reads the mask data creating program 17 from the ROM 2, expands it in a program storing area inside the RAM 3, and executes various processes. A variety of data generated during the execution of various processes is temporarily stored in a data storing area inside the RAM 3 by the CPU 1.

At the time of forming a photo mask, first a prototype of the photo mask (mother article) is created and then an actual article of the photo mask (derived article) is formed using information regarding patterns of the mother article. Thus, also at the time of forming the mask data, first the mask data 43 of the mother article is formed and then the mask data 43 of the derived article is formed using information regarding the pattern of the mother article. A mother article is a development article created at the development stage of a semiconductor device, while a derived article is created in bulk at the time of mass-producing the semiconductor device. While manufacturing a semiconductor device, first, a device test elementary group (TEG) is formed in the mother article. Then, registration of the design layout data of the derived article is performed using the pattern coverage ratio or the pattern boundary length (pattern total boundary length) obtained from the device TEG.

More particularly, at the time of forming the photo mask, first, the photo mask of the mother article is formed, the formed photo mask is used in transferring the patterns on a wafer (substrate), and the processing conversion difference (etching conversion difference) is measured. Subsequently, the photo mask is formed after setting a lithography target with consideration given to the measured processing conversion difference.

Figure 2:
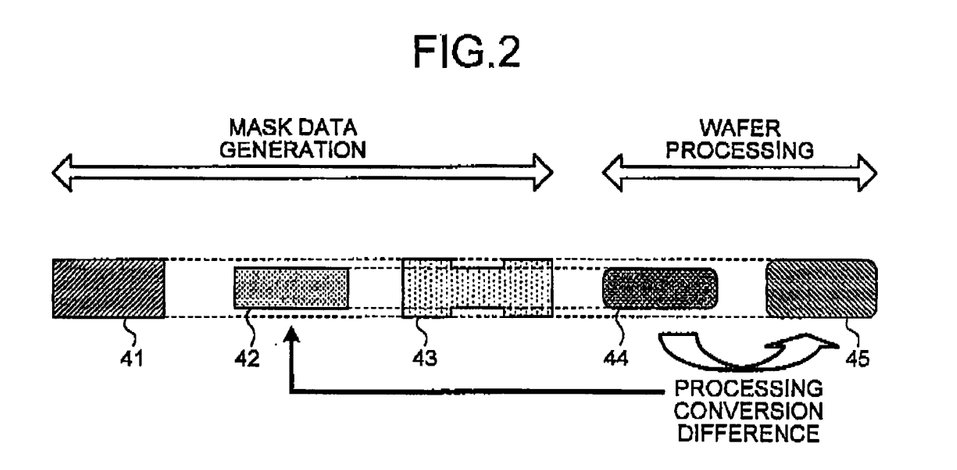
FIG. 2 is a schematic diagram for explaining a photo mask creation procedure.

Given below is the description about the difference in a mother article creation procedure and a derived article creation procedure. FIG. 2 is a schematic diagram for explaining a photo mask creation procedure. To form a wafer pattern with a mother article, first, a mask data generating process is performed on the mother article. Then, the mother article is formed based on the mask data thereof and the wafer processing is performed using the mother article. The mask data generating process for a mother article is performed, for example, by the pattern data creating apparatus 100.

In the mask data generating process for the mother article, first, design layout data 41 (pattern data formed on wafer) is generated. Then, the lithography target 42 is generated using the design layout data 41. The lithography target 42 is post-development resist pattern data that is required in creating patterns corresponding to the design layout data 41 on the wafer. Upon generating the lithography target 42, the mask data 43 of the mother article is generated using the lithography target 42. Meanwhile, in the case of performing an optical proximity effect on the lithography target 42, the dimension variation attributed to the optical proximity effect is estimated based on, for example, optical simulation.

Subsequently, the mother article is formed d based on the mask data 43 thereof and the wafer processing is started using the formed mother article. In the wafer processing, an exposure apparatus having the mother article set therein is used to perform lithographic exposure on the wafer that has a resist applied thereon. When the wafer is developed, the mask patterns get transferred on the wafer and the post-lithography resist pattern (post-lithography pattern 44) is formed on the wafer. On the wafer having the post-lithography pattern 44 formed thereon, the post-lithography pattern 44 is etched in the mask so that the post-etching pattern 45 is formed on the wafer.

Between the post-lithography pattern 44 (first pattern), which is the post-development resist shape, and the post-etching pattern 45 (second pattern), which is the post-etching pattern shape, occurs a processing conversion difference. In the present embodiment, that processing conversion difference is measured with a scanning electron microscope (SEM) or the like. Meanwhile, at the time of forming the mother article, it is also possible to reflect in advance the post-lithography processing conversion difference and the post-etching processing conversion difference in the lithography target 42. By doing that, it becomes possible to make the pattern shape corresponding to the design layout data 41 identical to the shape of the post-etching pattern 45. In that case too, the mask data 43 of the mother article is generated using the lithography target 42 and the mother article is formed based on the mask data 43 of the mother article.

In the present embodiment, after measuring the processing conversion difference, a correlation between the etching conversion difference and a predetermined physical quantity (pattern coverage ratio or pattern total surface area described later) is calculated. Then, at the time of forming the derived article, the etching conversion difference of the derived article is calculated using the calculated correlation. Subsequently, the lithography target 42 and the mask data 43 of the derived article are generated using the etching conversion difference. More particularly, first, the design layout data 41 of the derived article is generated and, based on the design layout data 41 of the derived article; the lithography target 42 of the derived article (new lithography target) is generated with consideration given to the etching conversion difference. Then, the mask data 43 (new mask data) is generated from the lithography target 42 of the derived article.

The photo mask as the derived article is formed based on the mask data 43 of the derived article. Then, using the derived article in the wafer processing, a semiconductor device (semiconductor integrated circuit) such as a semiconductor device is manufactured. More particularly, an exposure apparatus having the derived article set therein is used to perform lithographic exposure on the wafer and then the wafer is subjected to development processing and etching processing. In other words, on a lower layer film to be processed (e.g., mask material or silicon film), etching processing is performed by using the resist pattern, which is formed by transferring during the lithography process, in the mask. At the time of manufacturing the semiconductor device, the abovementioned exposure processing, the developing processing, and the etching processing are repeated for each layer.

Figure 3A:
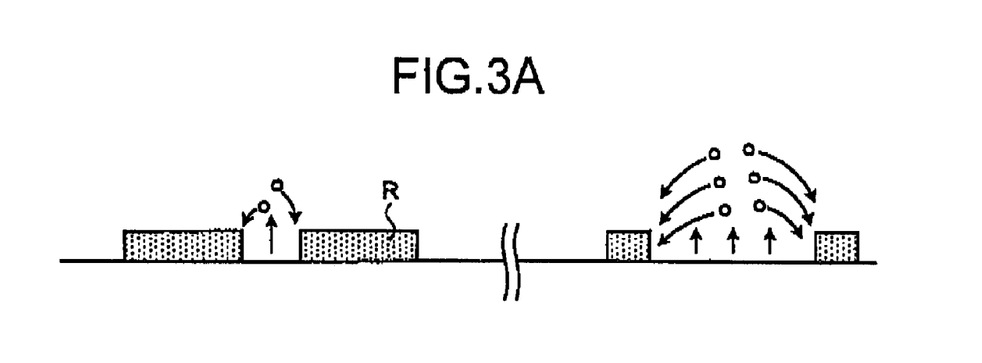
FIGS. 3A to 3C are schematic diagrams for explaining a physical quantity having a correlation with the etching conversion difference.
Figure 3B:
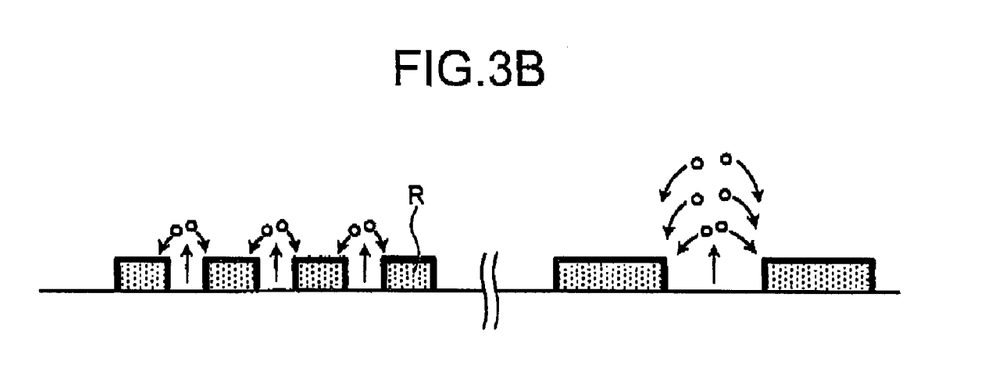
Figure 3C:
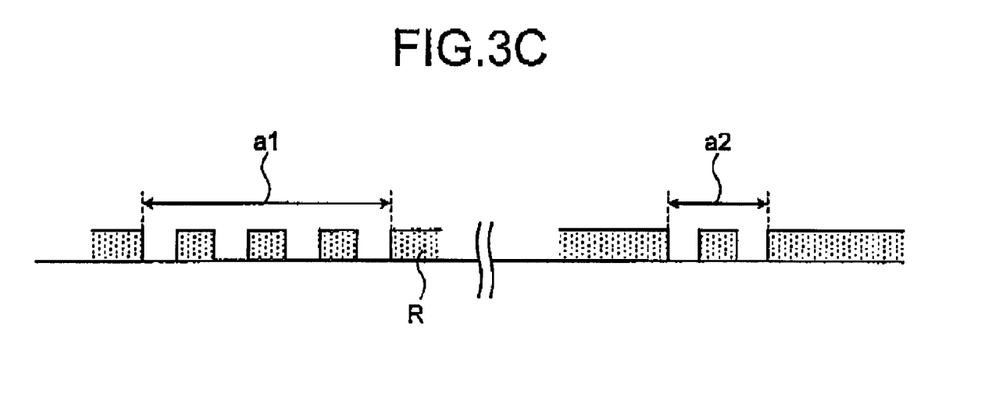

Given below is the description about a physical quantity that has a correlation with the etching conversion difference (hereinafter, sometimes referred to as "correlation physical quantity"). The etching conversion difference changes according to the size or crude density of the patterns. Moreover, the size or crude density of the patterns is determined according to the correlation physical quantity. FIGS. 3A to 3C are schematic diagrams for explaining the physical quantity having a correlation with the etching conversion difference. The correlation physical quantity can be the pattern coverage ratio, the pattern total surface area, the cell occupancy ratio, or the like. In FIGS. 3A to 3C, the relation between the etching conversion difference and the correlation physical quantity is explained using resist patterns R. The pattern total surface area, the pattern coverage ratio, or the cell occupancy ratio is calculated based on the mask data 43.

The pattern coverage ratio (area ratio) is the ratio (pattern forming ratio) of the region having actual patterns formed thereon with respect to a pattern forming region inside the photo mask. The pattern total surface area (length ratio) is the total surface area of the patterns exposed from among the resist patterns R formed on the wafer and represents the total area of the top surfaces and the side surfaces of the resist patterns R. The pattern total surface area can be calculated using the height and the total boundary length (side surface area) of the patterns formed on the wafer or can be calculated using only the total boundary length of the patterns formed on the wafer. The height of the patterns formed on the wafer can be assumed to be of a predetermined height or can be actually measured as the height dimension at a predetermined position.

The cell occupancy ratio is the ratio (cell region forming ratio) of the region having cell patterns formed thereon with respect to the pattern forming region inside the photo mask. In FIG. 3A, examples of patterns are illustrated for cases when the pattern coverage ratio is increased and when the pattern coverage ratio is reduced.

When the pattern coverage ratio is large as illustrated on the left side in FIG. 3A; the quantity of the film to be processed, which is subjected to etching at the time of forming the patterns on the wafer, decreases and the material generated during etching also decreases. Moreover, when the pattern coverage ratio is large, the pattern quantity (pattern top surface area) formed on the wafer is large. For that reason, the quantity of the material that is generated during etching and reattached to the patterns on the wafer (i.e., deposited material) decreases as compared to the pattern quantity formed on the wafer. In other words, the ratio of the quantity of the deposited material with respect to the pattern quantity (hereinafter, referred to as deposition ratio) decreases. Therefore, the dimension of the patterns formed on the wafer hardly becomes thick thereby leading to the formation of thin patterns.

On the other hand, when the pattern coverage ratio is small as illustrated on the right side in FIG. 3A; the quantity of the film to be processed, which is subjected to etching at the time of forming the patterns on the wafer, increases and the material generated during etching also increases. Moreover, when the pattern coverage ratio is small, the pattern quantity (pattern top surface area) formed on the wafer is small. For that reason, the quantity of the deposited material that is generated during etching and reattached to the patterns on the wafer increases as compared to the pattern quantity formed on the wafer. Therefore, the dimension of the patterns formed on the wafer becomes thick thereby leading to the formation of thick patterns.

In FIG. 3B are illustrated a pattern example when the pattern total surface area (side wall area) is increased and a pattern example when the pattern total surface area is reduced while keeping the pattern coverage area and the pattern top surface area constant in both the pattern examples. The pattern total surface area increases when the patterns are split and decreases when the patterns are integrated. Herein, since the pattern top surface area is constant, it can be considered that the quantity of the material generated during etching is almost constant irrespective of the pattern total surface area.

When the pattern total surface area is large as illustrated on the left side in FIG. 3B, the pattern quantity (top surface area and side surface area of the patterns) formed on the wafer is large. For that reason, the quantity of the deposited material that is generated during etching and reattached to the patterns on the wafer is smaller as compared to the pattern quantity formed on the wafer. In other words, the deposited material decreases. Therefore, the dimension of the patterns formed on the wafer hardly becomes thick thereby leading to the formation of thin patterns.

On the other hand, when the pattern total surface area is small as illustrated on the right side in FIG. 3B; the pattern quantity (top surface area and side surface area of the patterns) formed on the wafer is small. For that reason, the quantity of the deposited material that is generated during etching and reattached to the patterns on the wafer is larger as compared to the pattern quantity formed on the wafer. In other words, the deposited material increases. Therefore, the dimension of the patterns formed on the wafer becomes thick thereby leading to the formation of thick patterns.

In FIG. 3C are illustrated a pattern example when the cell occupancy ratio is increased (left side in FIG. 3C) and a pattern example when the cell occupancy ratio is reduced (right side in FIG. 3C) while keeping the pattern coverage area and the pattern total surface area substantially constant in both the pattern examples. Herein, since the pattern top surface area is constant, it can be considered that the quantity of the material generated during etching is almost constant irrespective of the pattern total surface area.

When the cell occupancy ratio is large, the pattern dimension other than a cell regional becomes thinner because cell etching takes a long time. On the other hand, when the cell occupancy ratio is small, the pattern dimension other than a cell region a2 becomes thicker because cell etching can be performed in a short time. For that reason, the pattern shapes formed in the region other than the cell regions a1 and a2 are different than the pattern shapes formed with the cell areas a1 and a2 (ISO shapes). Moreover, the difference in the pattern shapes changes due to the cell occupancy ratio. For example, the side edge portion of the patterns formed with the cell regions a1 and a2 undergoes deterioration and verticalization.

Figure 4:
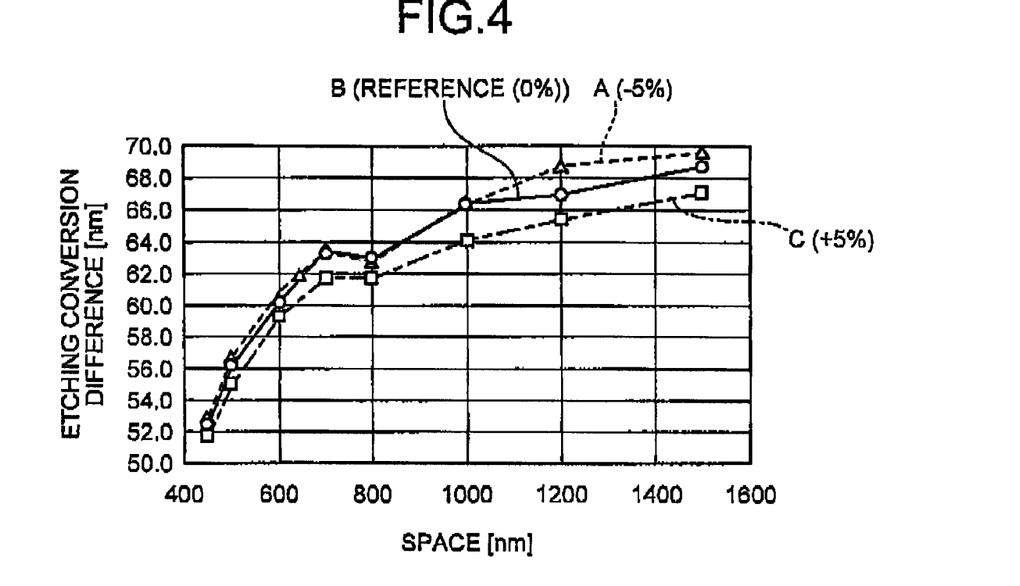
FIG. 4 is a graph representing correlations between the etching conversion difference and the pattern coverage ratio when the pattern coverage ratio is varied in different ways.

Given below is the description about a correlation between the etching conversion difference and the correlation physical quantity. FIG. 4 is a graph representing correlations between the etching conversion difference and the pattern coverage ratio when the pattern coverage ratio is varied in different ways. In the graph in FIG. 4 are plotted correspondence relations between the space dimension on the mask data 43 and the etching conversion difference when the inter-pattern space dimension is varied in different ways.

In FIG. 4 is illustrated an etching conversion difference B of a reference pattern (reference value), an etching conversion difference C when the pattern coverage ratio is increased by 5% (+5%) with respect to the reference value (0%), and an etching conversion difference A when the pattern coverage ratio is reduced by 5% (−5%) with respect to the reference value (0%). As illustrated in FIG. 4, the etching conversion difference C corresponding to +5% of the pattern coverage ratio becomes smaller than the etching conversion difference B corresponding to the reference value. Consequently, the pattern dimension corresponding to +5% of the pattern coverage ratio becomes thinner than the pattern dimension corresponding to the reference value. That happens because, as described above, the deposition ratio corresponding to +5% of the pattern coverage ratio is smaller than the deposition ratio corresponding to the reference value. Meanwhile, the etching conversion difference A corresponding to −5% of the pattern coverage ratio becomes larger than the etching conversion difference B corresponding to the reference value. Consequently, the pattern dimension corresponding to −5% of the pattern coverage ratio becomes thicker than the pattern dimension corresponding to the reference value. That happens because, as described above, the deposition ratio corresponding to −5% of the pattern coverage ratio is larger than the deposition ratio corresponding to the reference value.

Figure 5:
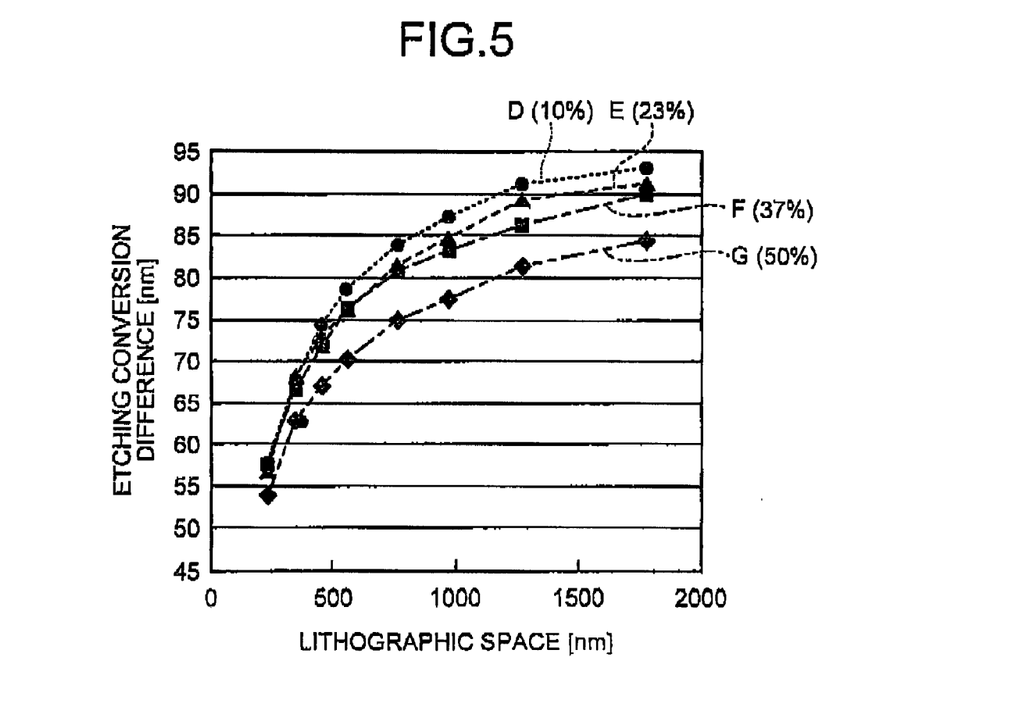
FIG. 5 is a graph representing correlations between the etching conversion difference and the total surface area when the total surface area is varied in different ways.

FIG. 5 is a graph representing correlations between the etching conversion difference and the total surface area when the total surface area is varied in different ways. In the graph in FIG. 5 are plotted correspondence relations between the space dimension and the etching dimension when the inter-pattern space dimension is varied in different ways.

In FIG. 5 is illustrated, with respect to the etching conversion difference corresponding to the reference pattern (0%), an etching conversion difference D when the pattern total surface area is increased by 10%, an etching conversion difference E when the pattern total surface area is increased by 23%, an etching conversion difference F when the pattern total surface area is increased by 37%, and an etching conversion difference G when the pattern total surface area is increased by 50%. As illustrated in FIG. 5, as the pattern total surface area increases, the etching conversion difference decreases. Thus, when the pattern total surface area is increased, the pattern dimension goes on becoming thinner because of the increase in the pattern total surface area. That happens because, as described above, an increase in the pattern total surface area leads to a decrease in the deposition ratio.

In this way, in the present embodiment, the etching conversion difference is measured when changes are made to the reference value of the etching conversion difference and the physical quantity (pattern coverage ratio or pattern total surface area described later) having a correlation with the etching conversion difference. The physical quantity having a correlation with the etching conversion difference can be measured using the mother article or using a new photo mask other than the mother article. To measure the etching conversion difference using the mother article, patterns corresponding to cases when changes are made to the physical quantity having a correlation with the etching conversion difference are set in advance in the mother article. Alternatively, to measure the etching conversion difference using a new photo mask other than the mother article, patterns corresponding to the cases when changes are made to the physical quantity having a correlation with the etching conversion difference are set in the new photo mask.

Figure 6:
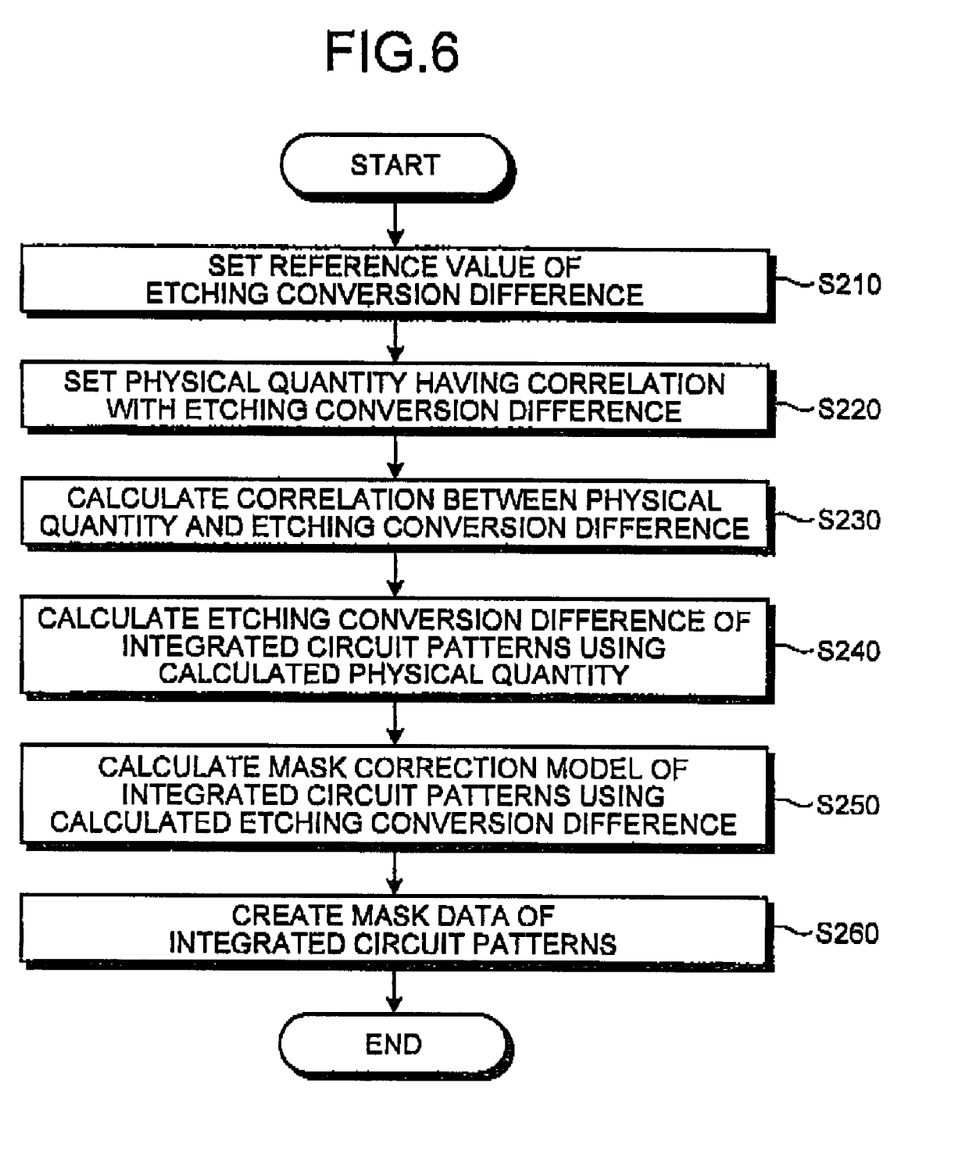
FIG. 6 is a flowchart for explaining a mask data creating procedure.

Given below is the description of a mask data (pattern data) creating procedure. FIG. 6 is a flowchart for explaining a mask data creating procedure. First, the reference value of the etching conversion difference is set (Step S210). Then, the physical quantity having a correlation with the etching conversion difference is set (Step S220). More particularly, instruction information specifying the correlation physical quantity is input at the input unit 5 of the pattern data creating apparatus 100. The correlation physical quantity can be the pattern coverage ratio, the pattern total surface area, the cell occupancy ratio, or the like. Herein, the description is given for the cases when the correlation physical quantity is the pattern coverage ratio and the pattern total surface area. Subsequently, based on experimental data, the pattern data creating apparatus 100 calculates the correlations between the etching conversion difference and the physical quantity (Step S230). The pattern coverage ratio or the pattern total surface area is calculated based on the design layout data 41, the lithography target 42, or the mask data 43 of the photo mask. The etching conversion difference is measured with an SEM. The calculated pattern coverage ratio, the calculated pattern total surface area, and the measured etching conversion difference are input to the pattern data creating apparatus 100. Based on that information, the pattern data creating apparatus 100 calculates the correlations between the etching conversion difference and the physical quantity.

More particularly, by using the photo mask (mother article) with various changes made to the pattern coverage ratio and the inter-pattern space dimension, the resist pattern R (post-lithography pattern 44) is formed on the wafer. Then, etching of the film to be processed is performed from above the post-lithography pattern so that the post-etching pattern 45 is formed on the wafer.

Subsequently, the etching conversion difference between the post-lithography pattern 44 and the post-etching pattern 45 is measured with an SEM. The pattern data creating apparatus 100 calculates the pattern coverage ratio of the patterns for which the etching conversion difference has been measured and calculates the correlation between the etching conversion difference and the physical quantity (pattern coverage ratio). For example, as illustrated in the graph in FIG. 4, the pattern data creating apparatus 100 calculates the correlation between the etching conversion difference and the pattern coverage ratio for each inter-pattern space dimension.

Besides, the pattern data creating apparatus 100 calculates the pattern total surface area of the patterns for which the etching conversion difference has been measured and calculates the correlation between the etching conversion difference and the physical quantity (pattern total surface area). For example, as illustrated in the graph in FIG. 5, the pattern data creating apparatus 100 calculates the correlation between the etching conversion difference and the pattern total surface area for each inter-pattern space dimension.

Subsequently, using the calculated correlations, the pattern data creating apparatus 100 calculates the etching conversion difference of the integrated circuit patterns that are the targets for creating the mask data 43 (Step S240). More particularly, the edge lines of the integrated circuit patterns are rendered with a plurality of points and the etching conversion difference is calculated according to the distance (space dimension) between each point and the pattern adjacent to that point.

Then, the pattern data creating apparatus 100 calculates a correspondence relation between the inter-pattern space dimension and the processing conversion difference using the correlation between the etching conversion difference and the pattern coverage ratio as well as the correlation between the etching conversion difference and the pattern total surface area.

Figure 7:
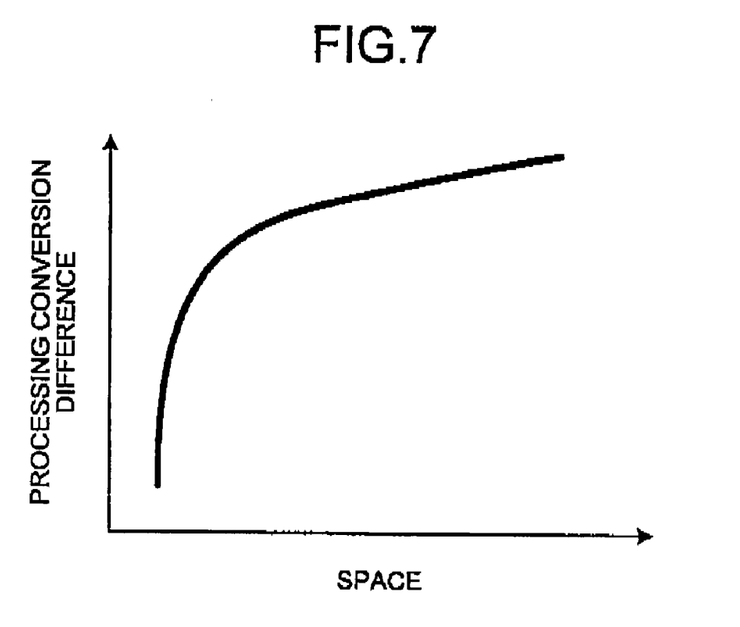
FIG. 7 is a graph representing the correspondence relation between the inter-pattern space dimension and the processing conversion difference.

FIG. 7 is a graph representing the correspondence relation between the inter-pattern space dimension and the processing conversion difference. As illustrated in FIG. 7, the inter-pattern space dimension and the processing conversion difference have a predetermined correspondence relation that is calculated by the pattern data creating apparatus 100. Since the correspondence relation calculated by the pattern data creating apparatus 100 is a correspondence relation according to the pattern coverage ratio and the pattern total surface area, the pattern data creating apparatus 100 calculates the correspondence relation for the pattern coverage ratio as well as for the pattern total surface area. Thus, when the pattern coverage ratio and the pattern total surface area are determined, one of the correspondence relations can be selected. The pattern data creating apparatus 100 stores the calculated correspondence relations as the mask correction model of the integrated circuit patterns in a database (not illustrated). In other words, the pattern data creating apparatus 100 calculates the etching conversion difference of the integrated circuit patterns and creates the mask correction model of the integrated circuit patterns based on the calculated etching conversion difference (Step S250). The mask correction model is configured so that when the pattern coverage ratio and the pattern total surface area are input, it is possible to determine the correspondence relation (correspondence relation between inter-pattern space dimension and processing conversion difference) according to the pattern coverage ratio and the pattern total surface area.

Figure 8:
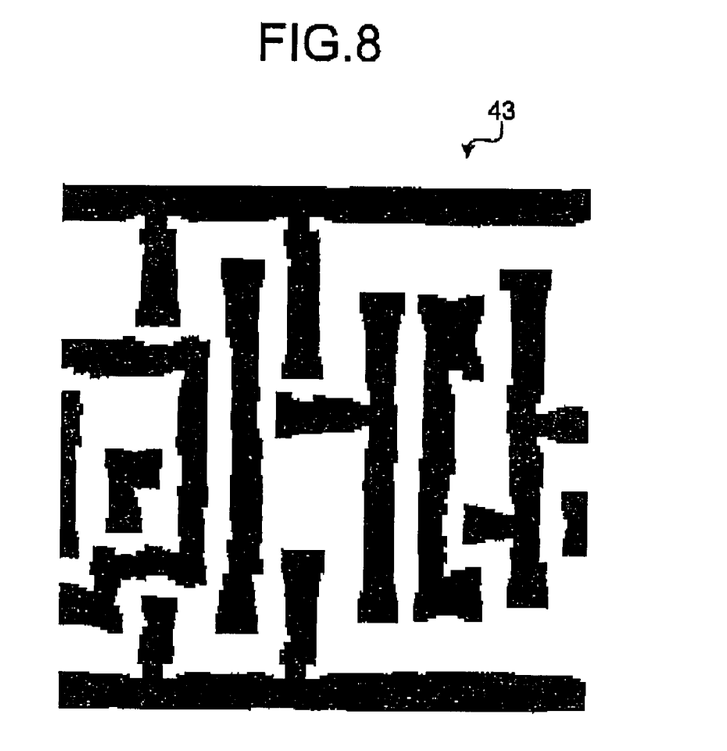
FIG. 8 is a schematic diagram of exemplary mask data.

Then, the pattern data creating apparatus 100 creates the mask data 43 of the integrated circuit patterns using the mask correction model (Step S260). At that time, the pattern data creating apparatus 100 creates the mask data 43 in such a way that the shapes of patterns (post-processing patterns) created on the wafer with the use of the photo mask that is created using the mask data 43 are identical to the shapes of design layout patterns. More particularly, the pattern data creating apparatus 100 renders the edge lines of the integrated circuit patterns with a plurality of points and, using the mask correction model, calculates the etching conversion difference according to the distance (space dimension) between each point and the pattern adjacent to that point. In addition, the pattern data creating apparatus 100 creates the mask data 43 using the calculated etching conversion difference. More particularly, the pattern data creating apparatus 100 creates the lithography target 42 from the design layout data 41 of the integrated circuit patterns using the etching conversion difference and creates the mask data 43 from the lithography target 42. FIG. 8 is a schematic diagram of exemplary mask data. At the time of creating the mask data 43, the pattern data creating apparatus 100 renders the edge lines of the design layout data 41 with a plurality of points, calculates the position of each point, and then connects the points.

Then, while creating the mask data 43, the pattern data creating apparatus 100 calculates the pattern coverage ratio or the pattern total surface area of the integrated circuit patterns as the targets for creating the mask data 43. Subsequently, the pattern data creating apparatus 100 calculates the etching conversion difference by inputting the calculated pattern coverage ratio and the calculated pattern total surface area in the mask correction model stored in the database and creates the mask data 43.

Meanwhile, in the present embodiment, the description is given about the case when the pattern data creating apparatus 100 creates the mask data 43 of the integrated circuit patterns after calculating the correlation between the etching conversion difference and a physical quantity. Alternatively, the pattern data creating apparatus 100 can also be configured to read the correlation between the etching conversion difference and a physical quantity from a database or the like and then create the mask data 43 of the integrated circuit patterns. In that case, the correlation between the etching conversion difference and the physical quantity is stored in advance in a database. The correlation between the etching conversion difference and the physical quantity can be calculated/set using an apparatus other than the pattern data creating apparatus 100 or can be calculated using the pattern data creating apparatus 100.

In this way, according to the present embodiment, the pattern data creating apparatus 100 calculates the pattern coverage ratio or the pattern total surface area of the film to be processed so that a semiconductor integrated circuit is formed as per the designed dimension. Then, based on the calculation result, the pattern data creating apparatus 100 calculates the lithography target 42 specific to the pattern coverage ratio or specific to the pattern total surface area and forms the photo mask. The formed photo mask is used in transferring the patterns on the wafer and the processing conversion difference is measured. The pattern data creating apparatus 100 then resets the lithography target 42 while giving consideration to the measured processing conversion difference and reforms the photo mask. While the pattern data creating apparatus 100 resets the lithography target 42, the processing conversion apparatus is adjusted to be equal to or less than a predetermined value.

In the present invention, the description is given for the case when the processing at Step S240 is performed. Instead, the processing at Step S240 can be eliminated. That is, the mask data 43 can be created using the correlation between the etching conversion difference and a physical quantity or can be created using the mask correction model.

Moreover, the description with reference to FIG. 6 is given for the case when the pattern coverage ratio or the pattern total surface area is used as the physical quantity. Alternatively, it is also possible to use the cell occupancy ratio as the physical quantity. Moreover, the description with reference to FIG. 6 is given for the case when the mask data 43 is created using two physical quantities. Instead, the mask data 43 can also be created using a single physical quantity or using three or more physical quantities. Furthermore, the pattern coverage ratio or the cell occupancy ratio can be calculated based on the lithography target 42 or the design layout data.

Besides, the description in the present embodiment is given for the case of creating the mask data 43 using the etching conversion difference. Alternatively, the mask data 43 can also be created using the dimension variation amount at the time of film formation (film formation conversion difference) or the dimension variation amount at the time of slimming processing.

Figure 9:
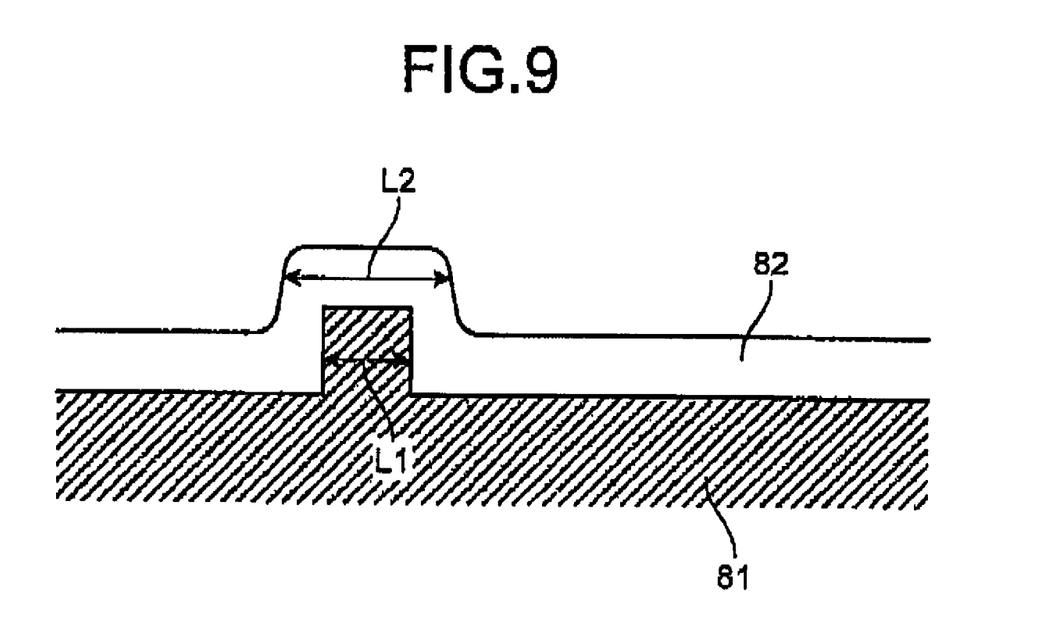
FIG. 9 is a schematic diagram for explaining the film formation conversion difference.

FIG. 9 is a schematic diagram for explaining the film formation conversion difference. When a film 82 is formed on a pattern 81 (first pattern) on a wafer using the chemical vapor deposition (CVD) technique, the dimension of the pattern 81 (second pattern) changes from L1 to L2. This film formation conversion difference can be measured using an SEM. Then, in an identical manner to the processing with the etching conversion difference, the pattern data creating apparatus 100 calculates the mask correction model or the mask data 43 that uses the film formation conversion difference. Meanwhile, the first pattern is made of, for example, a resist film, an amorphous silicon film, or a tetraethoxysilane (TEAS) film.

The correlation of a physical quantity with the etching conversion difference or the film formation conversion difference can be obtained by an experiment in which the physical quantity is changed in advance on the wafer or can be obtained based on a calculation result of optical simulation or the like. Moreover, in the present embodiment, although the resist pattern is formed by photolithography, it is also possible to use imprint lithography for forming the resist pattern (first pattern). In that case, the resist pattern (first pattern) having the remaining film thereof subjected to etching processing can be considered as a post-processing pattern (second pattern). Alternatively, the resist pattern having the lower layer film to be processed in the mask subjected to etching processing can be considered as the post-processing pattern (second pattern).

Consider a case when a mask material (first pattern) formed on a substrate is used in processing (etching, film formation, or slimming) the substrate for forming predetermined patterns, and the predetermined patterns are masked and the substrate is further processed to form the post-processing pattern (second pattern). Even in that case, as described in the present embodiment, based on the correlation between the pattern coverage ratio and the processing conversion difference of the first pattern or based on the correlation between the pattern total surface area and the processing conversion difference of the first pattern, the design dimension of the first pattern can be determined so that the second pattern has a predetermined dimension. In this way, at the time of processing the first pattern to form the second pattern, the processing can include a plurality of processing steps. Moreover, while forming the second pattern by performing a plurality of processing steps, the first pattern can be deleted before the second pattern is formed.

In this way, according to the present embodiment, the pattern data is created using the correlation between the pattern coverage ratio and the processing conversion difference or using the correlation between the pattern total surface area and the processing conversion difference. Thus, it becomes possible to create without difficulty the mask data of the photo mask while curbing the variability in the processing conversion difference.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented pattern data creating method comprising:

receiving, by a computer, a first correspondence relation between an amount of dimension variation and one of a pattern total surface area or a pattern boundary length of a first pattern formed on a substrate, the amount of dimension variation being a difference between the first pattern and a second pattern formed by processing the substrate using the first pattern; and creating, by a computer, pattern data for forming the first pattern.

2. The pattern data creating method according to claim 1, wherein the first pattern is a resist pattern and the second pattern is formed when etching is performed on the substrate with the first pattern as a mask.

3. The pattern data creating method according to claim 1, wherein the second pattern is formed by film formation on the substrate having the first pattern formed thereon.

4. The pattern data creating method according to claim 3, wherein the second pattern includes a pattern formed on a sidewall of the first pattern.

5. The pattern data creating method according to claim 1, further comprising to receiving a second correspondence relation between the amount of dimension variation and a pattern coverage ratio of the first pattern for creating the pattern data.

6. The pattern data creating method according to claim 1, further comprising receiving a third correspondence relation between the amount of dimension variation and a cell occupancy ratio of the first pattern for creating the pattern data.

7. The pattern data creating method according to claim 1, wherein the pattern data is created in such a way that a shape of the second pattern created using the pattern data is identical to a shape of a design layout pattern.

8. A non-transitory computer-readable storage medium storing instructions which when executed by a computer, cause the computer to perform a method including:

receiving a first correspondence relation between an amount of dimension variation and one of a pattern total surface area or a pattern boundary length of a first pattern formed on a substrate, the amount of dimension variation being a difference between the first pattern and a second pattern formed by processing the substrate using the first pattern and; and creating pattern data for forming the first pattern.

9. The storage medium according to claim 8, wherein the first pattern is a resist pattern and the second pattern is formed when etching is performed on the substrate with the first pattern as a mask.

10. The storage medium according to claim 8, wherein the second pattern is formed by film formation on the substrate having the first pattern formed thereon.

11. The storage medium according to claim 10, wherein the second pattern includes a pattern formed on a sidewall of the first pattern.

12. The storage medium according to claim 8, further comprising receiving a second correspondence relation between the amount of dimension variation and a pattern coverage ratio of the first pattern for creating the pattern data.

13. The storage medium according to claim 8, further comprising receiving a third correspondence relation between the amount of dimension variation and a cell occupancy ratio of the first pattern for creating the pattern data.

14. The storage medium according to claim 8, wherein the pattern data is created in such a way that a shape of the second pattern formed using the pattern data is identical to a shape of a design layout pattern.

15. A semiconductor device manufacturing method comprising:

receiving, by a computer, a first correspondence relation between an amount of dimension variation and one of a pattern total surface area or a pattern boundary length of a first pattern formed on a substrate, the amount of dimension variation being a difference between the first pattern and a second pattern formed by processing the substrate using the first pattern; and creating, by a computer, pattern data for forming the first pattern; and manufacturing a semiconductor device using the pattern data.

16. The semiconductor device manufacturing method according to claim 15, wherein the first pattern is a resist pattern and the second pattern is formed when etching is performed on the substrate with the first pattern as a mask.

17. The semiconductor device manufacturing method according to claim 15, wherein the second pattern is formed by film formation on the substrate having the first pattern formed thereon.

18. The semiconductor device manufacturing method according to claim 17, wherein the second pattern includes a pattern formed on a sidewall of the first pattern.

19. The semiconductor device manufacturing method according to claim 15, further comprising receiving a second correspondence relation between the amount of dimension variation and a pattern coverage ratio of the first pattern for creating the pattern data.

20. The semiconductor device manufacturing method according to claim 15, further comprising receiving a third correspondence relation between the amount of dimension variation and a cell occupancy ratio of the first pattern for creating the pattern data.

* * * * *